United States Patent
Ueno et al.

(10) Patent No.: US 11,070,027 B2
(45) Date of Patent: Jul. 20, 2021

(54) VARIABLE WAVELENGTH LIGHT SOURCE AND METHOD FOR CONTROLLING WAVELENGTH SWITCHING OF VARIABLE WAVELENGTH LIGHT SOURCE

(71) Applicant: MITSUBISHI ELECTRIC CORPORATION, Tokyo (JP)

(72) Inventors: Yuto Ueno, Tokyo (JP); Keita Mochizuki, Tokyo (JP); Kiyotomo Hasegawa, Tokyo (JP); Hayato Sano, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 468 days.

(21) Appl. No.: 16/088,615

(22) PCT Filed: May 16, 2016

(86) PCT No.: PCT/JP2016/064495
§ 371 (c)(1),
(2) Date: Sep. 26, 2018

(87) PCT Pub. No.: WO2017/199294
PCT Pub. Date: Nov. 23, 2017

(65) Prior Publication Data
US 2019/0109434 A1 Apr. 11, 2019

(51) Int. Cl.
*H01S 5/00* (2006.01)
*H01S 5/06* (2006.01)
(Continued)

(52) U.S. Cl.
CPC ........ *H01S 5/0612* (2013.01); *H01S 5/02453* (2013.01); *H01S 5/06804* (2013.01);
(Continued)

(58) Field of Classification Search
CPC .. H01S 5/0612; H01S 5/4087; H01S 5/06804; H01S 5/02453; H01S 5/0687;
(Continued)

(56) References Cited

U.S. PATENT DOCUMENTS

| 2002/0070359 A1* | 6/2002 | Kai | H01S 5/4031 250/504 R |
| 2011/0305253 A1* | 12/2011 | Kobayashi | H01S 5/4012 372/36 |
| 2016/0233642 A1* | 8/2016 | Takabayashi | H01S 5/4087 |

FOREIGN PATENT DOCUMENTS

| EP | 1841023 A2 * | 10/2007 | H01S 5/026 |
| JP | 2015-65406 A | 4/2015 | |

(Continued)

*Primary Examiner* — Mark Hellner
(74) *Attorney, Agent, or Firm* — Birch, Stewart, Kolasch & Birch, LLP.

(57) ABSTRACT

A wavelength tunable light source includes a wavelength tunable laser device and a control device. The wavelength tunable laser device includes: M laser diodes configured to generate laser oscillation to output beams; a multiplexer/demultiplexer configured to multiplex the beams output from the M laser diodes to bifurcate the beams for output; a first semiconductor optical amplifier configured to amplify one output beam of the bifurcated beams to output a first emitted beam; and a second semiconductor optical amplifier configured to amplify another output beam of the bifurcated beams to output a second emitted beam. The control device is configured to perform wavelength switching control on wavelengths of the first emitted beam and the second emitted beam by switching an electric power input to the second semiconductor optical amplifier.

9 Claims, 6 Drawing Sheets

(51) Int. Cl.
    *H01S 5/50*           (2006.01)
    *H01S 5/068*         (2006.01)
    *H01S 5/024*         (2006.01)
    *H01S 5/40*           (2006.01)
    *H01S 5/0687*       (2006.01)
    *H01S 5/062*         (2006.01)

(52) U.S. Cl.
    CPC .............. *H01S 5/4087* (2013.01); *H01S 5/50* (2013.01); *H01S 5/5027* (2013.01); *H01S 5/0617* (2013.01); *H01S 5/0687* (2013.01); *H01S 5/06216* (2013.01); *H01S 5/4012* (2013.01); *H01S 5/4031* (2013.01)

(58) Field of Classification Search
    CPC ...... H01S 5/06216; H01S 5/5027; H01S 5/50; H01S 5/4012; H01S 5/4031; H01S 5/0617
    USPC ......................................................... 359/344
    See application file for complete search history.

(56) References Cited

FOREIGN PATENT DOCUMENTS

| | | |
|---|---|---|
| JP | 2015-167174 A | 9/2015 |
| JP | 2015-207738 A | 11/2015 |

* cited by examiner

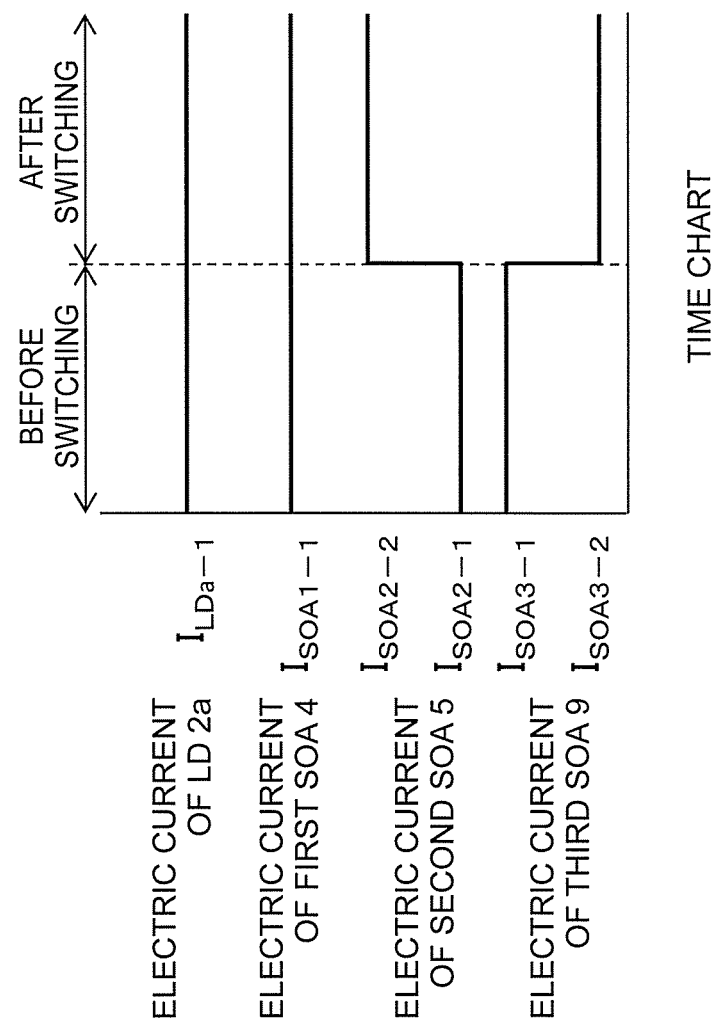

VARIABLE WAVELENGTH LIGHT SOURCE AND METHOD FOR CONTROLLING WAVELENGTH SWITCHING OF VARIABLE WAVELENGTH LIGHT SOURCE

TECHNICAL FIELD

The present invention relates to a wavelength tunable light source for use in digital coherent communication, and a wavelength switching control method for a wavelength tunable light source.

BACKGROUND ART

In recent years, in order to support dramatically increasing communication demands, in optical communication, a wavelength division multiplexing (hereinafter referred to as "WDM") system, which enables large-capacity transmission with a single optical fiber, has been introduced. As a light source, instead of preparing a plurality of light sources, each of which is configured to output only a corresponding wavelength, it is desired to use a wavelength tunable light source, which is capable of outputting a beam having a suitable wavelength, from the viewpoints of maintenance and operation.

Moreover, as a communication system, application of a digital coherent communication technology has become the mainstream. In coherent communication, apart from transmission light for carrying data, local oscillation light for interfering with the transmission light on a receiving side to reconstruct phase information is required. In order to reconstruct the phase information correctly, it is required that the transmission light and the local oscillation light have the same wavelength. Therefore, wavelength tunability is required of both the transmission light and the local oscillation light.

From the viewpoints of reducing power consumption and an installation area, there is proposed the structure in which one wavelength tunable light source is used for both of transmission light and local oscillation light (see Patent Literature 1, for example).

As performance of the wavelength tunable light source, there is an increasing demand for high-speed wavelength switching. Further, there are demands for wavelength restoration for switching to a new optical path during troubleshooting, and application for an optical switch, which is not affected by electric band or delay, for example.

To a semiconductor laser device used in the wavelength tunable light source, there can be applied a method of controlling a wavelength by temperature adjustment, and a method of controlling a wavelength by injecting an electric current to a control layer, which is provided to control the wavelength. The latter method has a problem in that a spectrum line width is degraded at the time of adjusting the wavelength. Therefore, the latter method is not suited for digital coherent communication, which requires a light source having a small line width.

In order to achieve the high-speed switching by the former method, temperature adjustment using a heat source in the device is promising from the viewpoint of a convergence speed of heat. For example, there is disclosed a method of performing temperature adjustment by changing, in a semiconductor laser device in which a plurality of laser diodes (hereinafter referred to as "LDs") are integrated, electric power input to an LD that is adjacent to an LD configured to generate laser oscillation at a time of wavelength switching (see Patent Literature 2, for example).

CITATION LIST

Patent Literature

[PTL 1] JP 2015-65406 A
[PTL 2] JP 2015-207738 A

SUMMARY OF INVENTION

Technical Problem

However, the related-art technologies have the following problems.

In a semiconductor laser device, a plurality of LDs having different wavelengths, an optical multiplexing circuit of a multi-mode interference type (hereinafter referred to as "MMI"), to which beams output from the LDs are input, and which is configured to multiplex the beams for output, and a semiconductor optical amplifier (hereinafter referred to as "SOA"), which is configured to amplify the beams output from the MMI, are generally integrated. Then, a related-art semiconductor laser device outputs beams having a desired wavelength through selection of an LD to generate laser oscillation and temperature adjustment of the LD.

Of the components of the device, the LD and the SOA serve as heat sources. Then, an amount of generated heat is changed when electric currents input to the LD and the SOA are changed, and hence a temperature of the LD can be adjusted. However, when an electric current is input to an LD other than the LD that is generating laser oscillation, crosstalk is increased and communication performance is degraded with an increase in spontaneously emitted light even when laser oscillation is not generated.

When the SOA serves as the heat source, and the electric current input to the SOA is changed, power of an emitted beam is changed. Therefore, there has been a problem in that, when this method is used for the digital coherent communication, an adjustable range of the SOA current is reduced for transmission light with strict power requirement.

To address such problem, there is a method in which another heat source, for example, a heater, is provided in the device and used for the temperature adjustment. However, there has been a problem in that a special structure for providing another power supply is required.

The present invention has been made to solve the above-mentioned problems, and therefore has an object to provide a wavelength tunable light source and a wavelength switching control method for a wavelength tunable light source, which are capable of increasing a wavelength tunable range of the transmission light without increasing crosstalk.

Solution to Problem

According to one embodiment of the present invention, there is provided a wavelength tunable light source including: a wavelength tunable laser device configured to output a first emitted beam and a second emitted beam from M beams, M being 2 or more; and a control device configured to perform control so as to switch wavelengths of the first emitted beam and the second emitted beam to a desired value by controlling the wavelength tunable laser device, wherein the wavelength tunable laser device includes: M laser diodes configured to generate laser oscillation to output beams; a multiplexer/demultiplexer configured to multiplex the beams output from the M laser diodes to bifurcate the beams into a first output beam and a second output beam for output; a first semiconductor optical amplifier configured to amplify the first output beam output from the multiplexer/demultiplexer to output the first emitted beam; and a second semiconductor optical amplifier configured to amplify the second output beam output from the multiplexer/demultiplexer to output the second emitted beam, and wherein the control device is configured to perform wavelength switching control on the wavelengths of the first emitted beam and the second emitted beam by switching an electric power input to the second semiconductor optical amplifier for temperature adjustment using the second semiconductor optical amplifier as a heat source.

Further, according to one embodiment of the present invention, there is provided a wavelength switching control method for a wavelength tunable light source, which is executed in a wavelength tunable light source including a wavelength tunable laser device and a control device, the wavelength tunable laser device including: M laser diodes configured to generate laser oscillation to output beams; a multiplexer/demultiplexer configured to multiplex the beams output from the M laser diodes to bifurcate the beams into a first output beam and a second output beam for output; a first semiconductor optical amplifier configured to amplify the first output beam output from the multiplexer/demultiplexer to output a first emitted beam; and a second semiconductor optical amplifier configured to amplify the second output beam output from the multiplexer/demultiplexer to output a second emitted beam, the control device being configured to perform control so as to switch wavelengths of the first emitted beam and the second emitted beam to a desired value by controlling the wavelength tunable laser device, the wavelength switching control method being executed by the control device and including: a first step of storing in advance, in order to perform control to switch both of the first emitted beam and the second emitted beam from a first wavelength before the switching to a second wavelength after the switching, when an electric power to be input to one of the M laser diodes is defined as an LD power, an electric power to be input to the first semiconductor optical amplifier is defined as a first SOA power, an electric power to be input to the second semiconductor optical amplifier is defined as a second SOA power, the first SOA power has the same value before and after the wavelength switching, the LD power and the second SOA power for obtaining the first wavelength are defined as a first power and a second power, respectively, and the LD power and the second SOA power for obtaining the second wavelength are defined as a third power and a fourth power, respectively, a correspondence among the first SOA power, the first power, the second power, the third power, and the fourth power in a storage unit; a second step of referring, when the first emitted beam and the second emitted beam having the first wavelength are to be output, to the correspondence stored in the storage unit to input the first SOA power to the first semiconductor optical amplifier, input the first power as the LD power, and input the second power as the second SOA power; and a third step of referring, when the first wavelength is to be switched to the second wavelength to output the first emitted beam and the second emitted beam, to the correspondence stored in the storage unit to maintain the electric power input to the first semiconductor optical amplifier at the first SOA power, input the third power as the LD power, and input the fourth power as the second SOA power.

Advantageous Effects of Invention

According to one embodiment of the present invention, there is adopted a configuration in which, with one of two SOAs being a heat source, control is performed to switch a wavelength of emitted laser beams to a desired value by controlling an amount of electric power input to the one SOA. As a result, there can be obtained the wavelength tunable light source and the wavelength switching control method for a wavelength tunable light source, which are capable of increasing the wavelength tunable range of the transmission light without increasing the crosstalk.

BRIEF DESCRIPTION OF DRAWINGS

FIG. 6 is a time chart for showing states of current values in a case where wavelength switching is performed by a control processing unit based on data stored in a storage unit in the fourth embodiment of the present invention.

DESCRIPTION OF EMBODIMENTS

Now, with reference to the drawings, a wavelength tunable light source and a wavelength switching control method for a wavelength tunable light source according to exemplary embodiments of the present invention are described.

First Embodiment

Figure 1:
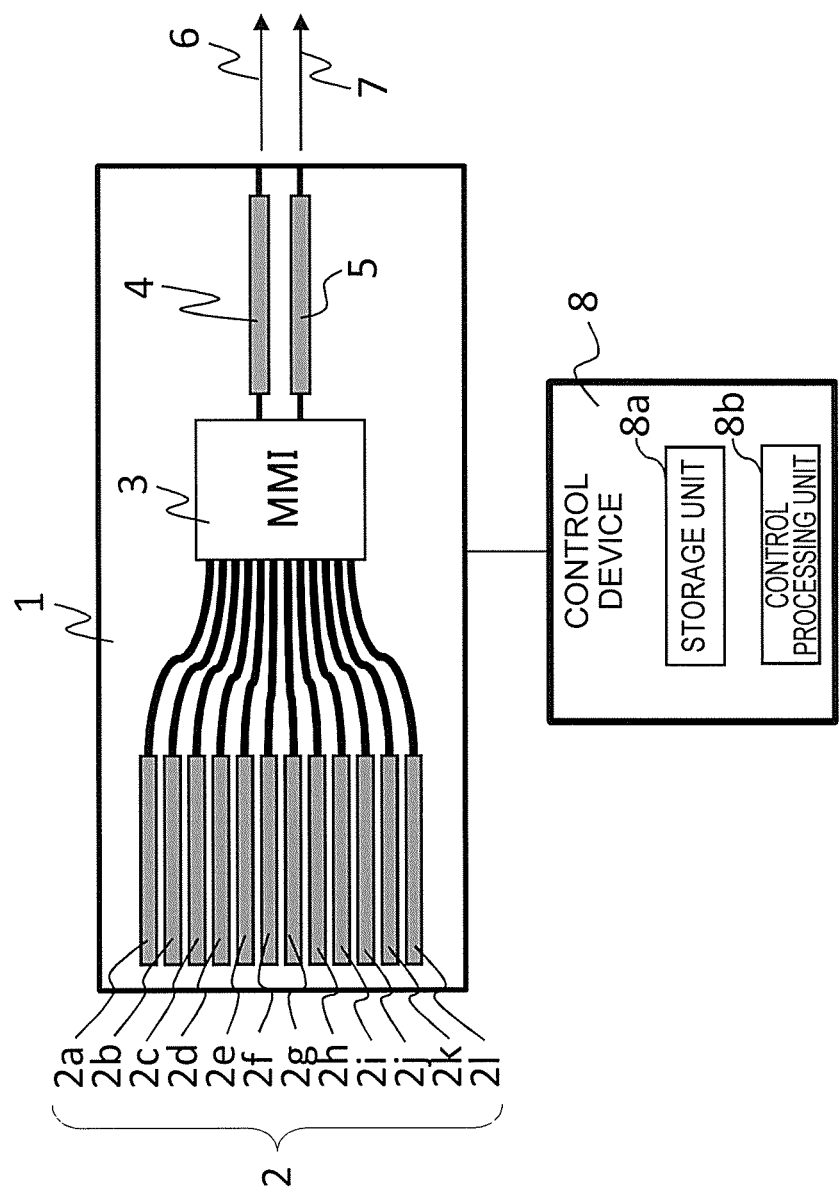
FIG. 1 is a configuration diagram of a wavelength tunable light source according to a first embodiment of the present invention.

FIG. 1 is a configuration diagram of a wavelength tunable light source according to a first embodiment of the present invention. A wavelength tunable laser device 1, which corresponds to the wavelength tunable light source according to the first embodiment, includes LDs 2, an MMI 3, a first SOA 4, and a second SOA 5.

In this example, the LDs 2 exemplified in FIG. 1 consist of twelve LDs 2a to 2l, which are configured to generate laser oscillation to generate beams. Then, the MMI 3 multiplexes outputs from the twelve LDs 2a to 2l to bifurcate the outputs for output.

The first SOA 4 is configured to amplify one beam of the two outputs from the MMI 3 for output as a first emitted beam 6. Similarly, the second SOA 5 is configured to amplify the other beam of the two outputs from the MMI 3 for output as a second emitted beam 7.

An MMI 3 having K inputs (K is a natural number) and L outputs (L is a natural number) is hereinafter notated as a K×L-MMI. The MMI 3 in the first embodiment, which is illustrated in FIG. 1, corresponds to a 12×2-MMI.

As described above, from the wavelength tunable laser device 1, two laser beams: the first emitted beam 6 and the second emitted beam 7 are emitted. In the first embodiment, the following description is made assuming that the first emitted beam 6 is used as transmission light, and that the second emitted beam 7 is used as local oscillation light.

To the wavelength tunable laser device 1, a control device 8 including a storage unit 8a and a control processing unit 8b is connected. The storage unit 8a is a storage device in which current amounts input to an LD 2, the first SOA 4, and the second SOA 5 before and after the wavelength switching are stored in association with wavelengths. Moreover, the control processing unit 8b is a controller configured to adjust the current amounts input to the LD 2, the first SOA 4, and the second SOA 5 based on data stored in the storage unit 8a to perform wavelength switching control.

Next, a control method during a wavelength switching operation is specifically described. In the control method according to the first embodiment, driving conditions (that is, current values to be input) before and after wavelength switching of the LD 2 configured to generate laser oscillation, the first SOA 4, and the second SOA 5 are acquired in advance through an experiment or the like. A case in which the LD 2a is adopted as the LD 2 is described below as an example.

First, values of an electric current $I_{LDa-1}$ input to the LD 2a configured to generate a wavelength $\lambda_1$ before switching, an electric current $I_{SOA1-1}$ input to the first SOA 4, and an electric current $I_{SOA2-1}$ input to the second SOA 5 are acquired with the use of a wavemeter and an ammeter to be stored as data on $\lambda_1$ in the storage unit 8a of the control device 8 such that the wavelength $\lambda_1$ and the current values are associated with each other.

Next, switching is performed from a state in which the electric current $I_{LDa-1}$ is input to the LD 2a, the electric current $I_{SOA1-1}$ is input to the first SOA 4, and the electric current $I_{SOA2-1}$ is input to the second SOA 5 such that only the electric current input to the second SOA 5 is changed. Then, an electric current $I_{SOA2-2}$ input to the second SOA 5 to generate a wavelength $\lambda_2$ after the switching is acquired with the use of the wavemeter and the ammeter to be stored as data on $\lambda_2$ in the storage unit 8a of the control device 8 such that the wavelength $\lambda_2$ and the current values are associated with each other.

In this example, when the wavelength $\lambda_2$ is longer than the wavelength $\lambda_1$, a temperature of the LD is required to be increased at the time of the wavelength switching, and hence the following relationship is established: $I_{SOA2-2} > I_{SOA2-1}$. In contrast, when the wavelength $\lambda_2$ is shorter than the wavelength $\lambda_1$, the temperature of the LD is required to be decreased at the time of the wavelength switching, and hence the following relationship is established: $I_{SOA2-2} < I_{SOA2-1}$.

There is not one but a plurality of combinations of current value data items for generating the wavelength $\lambda_1$ and combinations of current value data items for generating the wavelength $\lambda_2$. Those combinations may be determined appropriately in view of required performance for powers of the transmission light and the local oscillation light, power consumption, and the like.

Moreover, both of the first emitted beam 6 and the second emitted beam 7 are emitted beams obtained by amplifying, by the first SOA 4 and the second SOA 5, respectively, the beams generated by the LDs 2. Here, the wavelength is not changed by the amplification in each SOA, and hence the first emitted beam 6 and the second emitted beam 7 have the same wavelength.

Therefore, when the wavelength is measured in the experiment performed in advance to acquire the data on the wavelength $\lambda_1$ and the wavelength $\lambda_2$, any one of the first emitted beam 6 and the second emitted beam 7 may be used.

Figure 2:
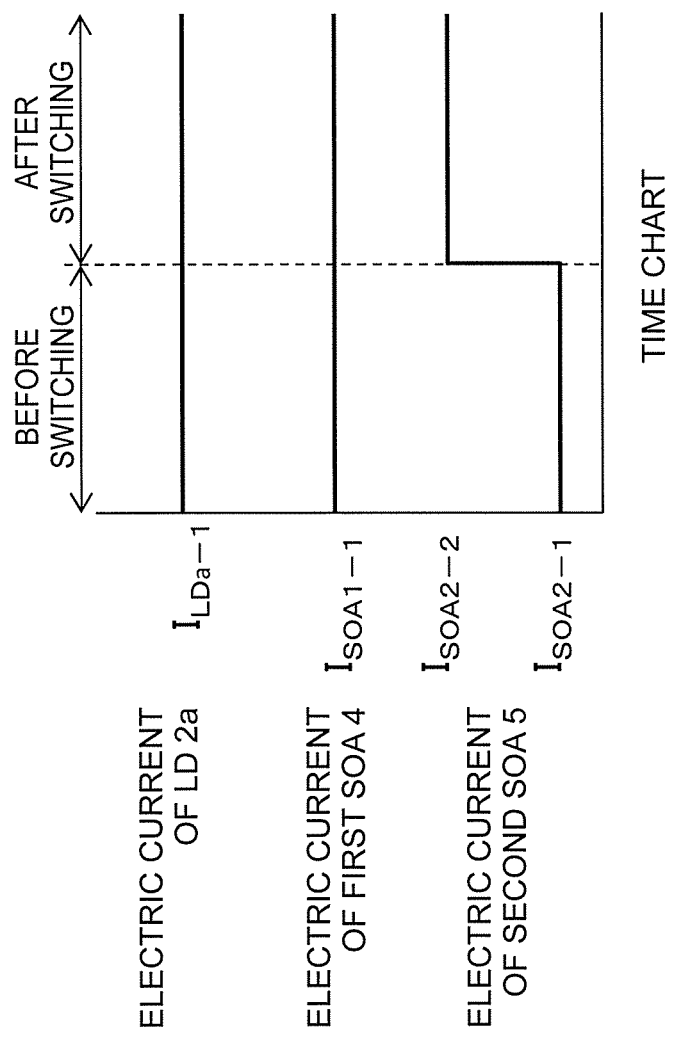
FIG. 2 is a time chart for showing states of current values in a case where wavelength switching is performed by a control processing unit based on data stored in a storage unit in the first embodiment of the present invention.

FIG. 2 is a time chart for showing states of the current values in the case where the wavelength switching is performed by the control processing unit 8b based on the data stored in the storage unit 8a in the first embodiment of the present invention. As shown in FIG. 2, before the wavelength switching, the electric current $I_{LDa-1}$, the electric current $I_{SOA1-1}$, and the electric current $I_{SOA2-1}$ are applied to the LD 2a, the first SOA 4, and the second SOA 5, respectively.

Then, after the wavelength switching, the control processing unit 8b switches the electric current applied to the second SOA 5 from $I_{SOA2-1}$ to $I_{SOA2-2}$ without changing the electric currents applied to the LD 2a and the first SOA 4. Such switching control is performed by feedforward control.

In this example, assuming the case in which the wavelength $\lambda_2$ is longer than the wavelength $\lambda_1$, $I_{SOA2-2} > I_{SOA2-1}$ is satisfied. It should be noted, however, that when the wavelength $\lambda_2$ is shorter than the wavelength $\lambda_1$, $I_{SOA2-2} < I_{SOA2-1}$ is satisfied.

Further, in this example, there has been described the case in which the control device 8 performs the wavelength switching by switching the input current assuming a constant current source. It should be noted, however, that the control device 8 may perform the wavelength switching by switching an applied voltage with the use of a constant voltage source instead of the constant current source. In other words, it is only required that the wavelength switching be performed through temperature adjustment by controlling input electric power using an SOA as a heat source.

In this case, a voltage $V_{LDa-1}$ applied to the LD 2a, a voltage $V_{SOA1-1}$ applied to the first SOA 4, and a voltage $V_{SOA2-1}$ applied to the second SOA 5 when the wavelength $\lambda_1$ is generated, and a voltage $V_{SOA2-2}$ applied to the second SOA 5 when the wavelength $\lambda_2$ is generated are acquired with the use of the wavemeter and a voltmeter in an experiment performed in advance, to be stored as data before and after the switching in the storage unit 8a of the control device 8.

Then, at the time of the wavelength switching, from a state in which the voltage $V_{LDa-1}$, the voltage $V_{SOA1-1}$, and the voltage $V_{SOA2-1}$ are applied to the LD 2a, the first SOA 4, and the second SOA 5, respectively, the control processing unit 8b switches the voltage applied to the second SOA 5 from $V_{SOA2-1}$ to $V_{SOA2-2}$.

Next, actions and effects of the wavelength tunable light source according to the first embodiment are described.

In the first embodiment, the wavelength of the first emitted beam 6 and the wavelength of the second emitted beam 7 are both tunable through temperature adjustment of the LD 2a. Therefore, the wavelengths of both of the first emitted beam 6 and the second emitted beam 7 can be changed by changing the electric current input to the second SOA 5, which serves as the heat source, and adjusting the temperature of the LD 2a as a result.

When two light sources are supplied for digital coherent communication, power required of the transmission light is larger than that of the local oscillation light. Therefore, when the wavelength switching control in the first embodiment is performed using the first emitted beam 6 as the transmission light and using the second emitted beam 7 as the local oscillation light, through the temperature adjustment using the SOA for the local oscillation light, which has a wide current adjustment width, as the heat source, the wavelengths of not only the local oscillation light but also the transmission light can be switched. As a result, there is obtained the effect that a wavelength tunable range of the transmission light is increased.

Moreover, in the wavelength switching control in the first embodiment, no electric current is input to LDs other than the LD that is generating laser oscillation. Therefore, the wavelength switching can be performed without increasing crosstalk.

In the first embodiment, the 12×2-MMI is used, but as long as the MMI 3 is designed appropriately, the LD output beams can be multiplexed and output at a ratio that is similar to a case of a 12×1-MMI.

Therefore, as compared to the related art in which two light sources using 12×1-MMIs are prepared for use as the transmission light and the local oscillation light, respectively, input powers to the SOAs are at the same level, and hence a current adjustment range of the SOAs is not reduced.

Further, other than the LD 2, the first SOA 4, and the second SOA 5, a heater or other heat sources is not provided to the wavelength tunable laser device 1 in the first embodiment. Therefore, the number of current sources or voltage sources required by the control device 8 can be decreased, and there is obtained the effect that cost of the wavelength tunable light source can be reduced.

Moreover, in the first embodiment, there has been described the case in which the electric current input to the first SOA 4 is kept constant before and after the wavelength switching. However, the electric current input to the first SOA 4 is not required to be constant, and may be changed in a range that satisfies a power requirement for the transmission light.

Further, the number of LDs 2 is not required to be 12, and may be less than 12 or more than 12. In that case, the number of inputs to the MMI 3 has the same value as the number of LDs 2. In other words, when the number of LDs 2 is M (M is a natural number), the MMI 3 is an M×2-MMI.

Moreover, the LD to oscillate has been described as the LD 2a. However, the LD to oscillate is not necessarily limited to the LD 2a, and another LD may oscillate depending on the required wavelength.

Moreover, in the first embodiment, the first emitted beam 6 is used as the transmission light, and the second emitted beam 7 is used as the local oscillation light. However, the first emitted beam 6 may be used as the local oscillation light, and the second emitted beam 7 may be used as the transmission light. In that case, the control processing unit 8b performs the wavelength switching control such that only the electric current input to the first SOA 4 is switched without switching the electric currents input to the LD 2a and the second SOA 5 at the time of the wavelength switching.

Moreover, in the first embodiment, assuming the case in which the power required of the transmission light is larger than that of the local oscillation light as in the digital coherent communication, there has been described the case in which the electric current input to the SOA on the local oscillation light side is changed at the time of the wavelength switching. However, in applications in which power required of the local oscillation light is larger than that of the transmission light, the control processing unit 8b may change the electric current input to the SOA on the transmission light side at the time of the wavelength switching.

As described above, according to the first embodiment, there is adopted the configuration in which the control to switch the wavelength of the emitted laser beams to a desired value is performed by controlling the value of the electric current input to one SOA. As a result, it is possible to achieve the wavelength tunable light source, and the control method for the wavelength tunable light source, which are capable of increasing the wavelength tunable range of the transmission light without increasing the crosstalk.

Second Embodiment

In the first embodiment described above, there has been described the case in which the wavelength switching control is performed by varying the current value of the second SOA 5. In contrast, in a second embodiment of the present invention, a description is given of a case in which wavelength switching control is performed by varying, in addition to the current value of the second SOA 5, the value of the electric current applied to the LD 2. The device configuration is similar to FIG. 1 in the first embodiment described above.

A control method during a wavelength switching operation in the second embodiment is specifically described. First, as in the first embodiment described above, as data on a wavelength $\lambda_1$ before wavelength switching, measurement data on an electric current $I_{LDa-1}$, an electric current $I_{SOA1-1}$, and an electric current $I_{SOA2-1}$ is acquired in an experiment performed in advance, for example. Then, the acquired measurement data is stored as the data on $\lambda_1$ in the storage unit 8a of the control device 8.

Next, when data on a wavelength $\lambda_2$ after the wavelength switching is acquired, from a state in which the electric current $I_{LDa-1}$, the electric current $I_{SOA1-1}$, and the electric current $I_{SOA2-1}$ are input to the LD 2a, the first SOA 4, and the second SOA 5, respectively, not only the electric current of the second SOA 5 but also the electric current of the LD 2 is changed without changing the electric current input to the first SOA 4.

Then, an electric current $I_{LDa-2}$ input to the LD 2a and an electric current $I_{SOA2-2}$ input to the second SOA 5 for generating the wavelength $\lambda_2$ after the switching are acquired with the use of a wavemeter and an ammeter to be stored as data on $\lambda_2$ in the storage unit 8a of the control device 8.

Figure 3:
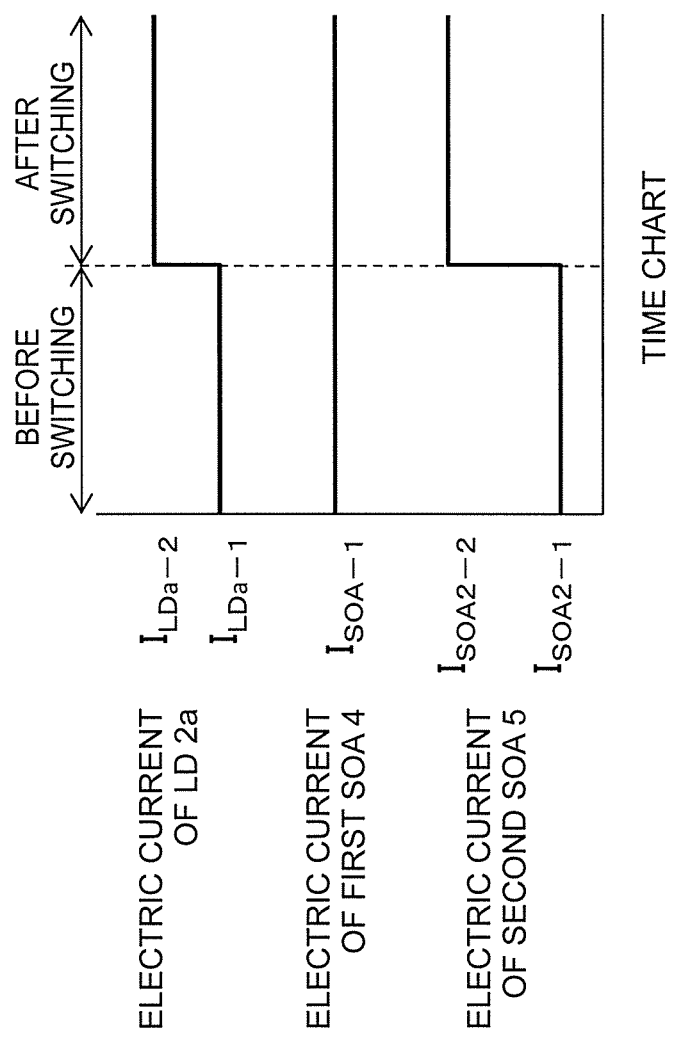
FIG. 3 is a time chart for showing states of current values in a case where wavelength switching is performed by a control processing unit based on data stored in a storage unit in a second embodiment of the present invention.

FIG. 3 is a time chart for showing states of the current values in the case where the wavelength switching is performed by the control processing unit 8b based on the data stored in the storage unit 8a in the second embodiment of the present invention. As shown in FIG. 3, before the wavelength switching, the electric current $I_{LDa-1}$, the electric current $I_{SOA1-1}$, and the electric current $I_{SOA2-1}$ are applied to the LD 2a, the first SOA 4, and the second SOA 5, respectively.

Then, after the switching, the control processing unit 8b switches the electric current applied to the LD 2a from $I_{LDa-1}$ to $I_{LDa-2}$, and switches the electric current applied to the second SOA 5 from $I_{SOA2-1}$ to $I_{SOA2-2}$ without changing the electric current applied to the first SOA 4. Such switching control is performed by feedforward control.

In this example, assuming the case in which the wavelength $\lambda_2$ is longer than the wavelength $\lambda_1$, $I_{LDa-2} > I_{LDa-1}$ and $I_{SOA2-2} > I_{SOA2-1}$ are satisfied. It should be noted, however, that when the wavelength $\lambda_2$ is shorter than the wavelength $\lambda_1$, $I_{LDa-2} < I_{LDa-1}$ and $I_{SOA2-2} < I_{SOA2-1}$ are satisfied.

Next, actions and effects of the wavelength tunable light source according to the second embodiment are described.

In the second embodiment, not only the second SOA 5 but also the LD 2a itself is used as a heat source configured to adjust a temperature of the LD 2a. Here, when the electric current of the LD 2a is changed, spectrum line widths of the first emitted beam 6 and the second emitted beam 7 are changed.

In the digital coherent communication, in order to cause stable interference between the transmission light and the local oscillation light, a requirement on the spectrum line width is also provided. Therefore, when the electric current input to the LD 2a is changed in the range that satisfies the requirement of the spectrum line width, an adjustable range of the temperature of the LD 2a is increased as compared to the case in which only the first SOA 4 is used as the heat source. As a result, the wavelength switching control as in the second embodiment may be performed to obtain the effect that the wavelength tunable range is increased.

As described above, according to the second embodiment, there is adopted the configuration in which the control to switch the wavelength of the emitted laser beams to a desired value is performed by controlling the current value input to the LD itself as well as the current value input to the SOA to be variable. As a result, effects similar to those of the first embodiment described above can be obtained, and there can be obtained a further effect that the wavelength tunable range can be increased, and hence that the applicability can be widened.

Third Embodiment

In the first and second embodiments described above, there has been described the case in which the LD configured to generate laser oscillation is only the LD 2a before and after the wavelength switching. In contrast, in a third embodiment of the present invention, a description is given of a case in which the LD configured to generate laser oscillation is different before and after the wavelength switching. The device configuration is similar to FIG. 1 in the first embodiment described above.

A control method during a wavelength switching operation in the third embodiment is specifically described. First, as in the first embodiment described above, as data before the wavelength switching, measurement data on an electric current $I_{LDa-1}$, an electric current $I_{SOA1-1}$, and an electric current $I_{SOA2-1}$ is acquired as data on a wavelength $\lambda_1$ in an experiment performed in advance, for example. Then, the acquired measurement data is stored as the data on $\lambda_1$ in the storage unit 8a of the control device 8.

Next, when data on a wavelength $\lambda_2$ after the wavelength switching is acquired, from a state in which no electric current is input to the LD 2a to oscillate before the wavelength switching, and in which an electric current $I_{LDb-2}$ is input to the LD 2b to oscillate after the wavelength switching, and a state in which the electric current $I_{SOA1-1}$ and the electric current $I_{SOA2-1}$ are input to the first SOA 4 and the second SOA 5, respectively, only the electric current input to the second SOA 5 is changed, and an electric current $I_{SOA2-2}$ for generating the wavelength $\lambda_2$ is acquired. Then, the acquired measurement data is stored as data on $\lambda_2$ in the storage unit 8a of the control device 8.

The electric current $I_{LDb-2}$ is set such that the outputs of the LDs are at the same level for the case in which $I_{LDa-1}$ is input to the LD 2a and the case in which $I_{LDb-2}$ is input to the LD 2b.

Figure 4:
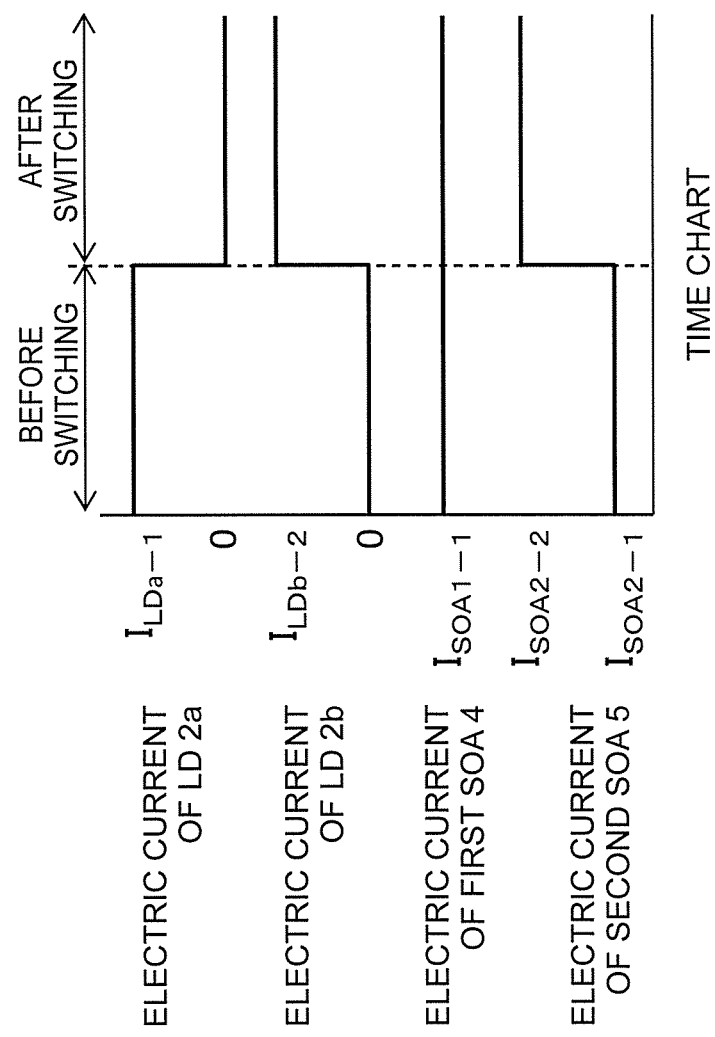
FIG. 4 is a time chart for showing states of current values in a case where wavelength switching is performed by a control processing unit based on data stored in a storage unit in a third embodiment of the present invention.

FIG. 4 is a time chart for showing states of the current values in the case where the wavelength switching is performed by the control processing unit 8b based on the data stored in the storage unit 8a in the third embodiment of the present invention. As shown in FIG. 4, before the wavelength switching, the electric current $I_{LDa-1}$, the electric current $I_{SOA1-1}$, and the electric current $I_{SOA2-1}$ are applied to the LD 2a, the first SOA 4, and the second SOA 5, respectively.

Then, after the switching, the control processing unit 8b inputs no electric current to the LD 2a, inputs $I_{LDb-2}$ to the LD 2b, and switches the electric current applied to the second SOA 5 from $I_{SOA2-1}$ to $I_{SOA2-2}$ without changing the electric current applied to the first SOA 4. Such switching control is performed by feedforward control.

Next, actions and effects of the wavelength tunable light source according to the third embodiment are described.

In the third embodiment, not only temperatures of the LDs are adjusted but also the LD configured to generate laser oscillation is changed at the time of wavelength switching. As a result, there is obtained the effect that the wavelength tunable range is increased.

Moreover, the outputs of the LDs 2 before and after the wavelength switching, that is, the output of the LD 2a before the wavelength switching and the output of the LD 2b after the wavelength switching are set to the same level. Further, the electric current input to the first SOA 4 is not changed. As a result, power of the transmission light is kept substantially constant before and after the wavelength switching.

Moreover, in the third embodiment, the LD configured to generate laser oscillation is switched, but the electric current is input to only one LD before and after the wavelength switching. Therefore, the crosstalk is not increased.

In the third embodiment, the electric current $I_{LDa-1}$ and the electric current $I_{LDb-2}$ are set so that the outputs of the LDs 2 are not changed before and after the wavelength switching. It should be noted, however, that even when the outputs are not strictly the same, the electric current $I_{LDb-2}$ may be varied within the range in which the power of the transmission light satisfies the required value.

Moreover, in this example, $I_{SOA2-2} > I_{SOA2-1}$ is satisfied, but $I_{SOA2-2} < I_{SOA2-1}$ is satisfied in some cases depending on the wavelength $\lambda_2$ after the switching. In other words, under a state in which the electric current $I_{LDb-2}$, the electric current $I_{SOA1-1}$, and the electric current $I_{SOA2-1}$ are input to the LD 2b, the first SOA 4, and the second SOA 5, respectively, when the wavelength $\lambda_2$ after the switching is longer than the wavelength $\lambda_1$ before switching, $I_{SOA2-2} > I_{SOA2-1}$ is satisfied because temperatures of the LDs 2 is required to be increased.

In contrast, when the wavelength $\lambda_2$ after the switching is shorter than the wavelength $\lambda_1$ before the switching, $I_{SOA2-2} < I_{SOA2-1}$ is satisfied because the temperatures of the LDs 2 is required to be decreased.

Moreover, in the third embodiment, there has been exemplified the case in which the LD 2a oscillates before the wavelength switching, and the LD 2b oscillates after the wavelength switching. However, the combination is not necessarily limited thereto, and a combination of other LDs may be adopted depending on the wavelength required before and after the wavelength switching.

As described above, according to the third embodiment, there is described the configuration in which, while the control is performed to change the LD to oscillate before and after the wavelength switching, the control to switch the wavelength of the emitted laser beams to a desired value is performed. As a result, effects similar to those of the first embodiment described above can be obtained, and as in the second embodiment described above, the wavelength tunable range can be increased, and there can be obtained a further effect that the applicability can be widened.

Fourth Embodiment

In the first to third embodiments described above, there has been described the configuration in which the SOA 5 is adopted as the SOA configured to amplify the second emitted beam 7. In contrast, in a fourth embodiment of the present invention, a description is given of a configuration further including an SOA 9 in a stage subsequent to the SOA 5.

Figure 5:
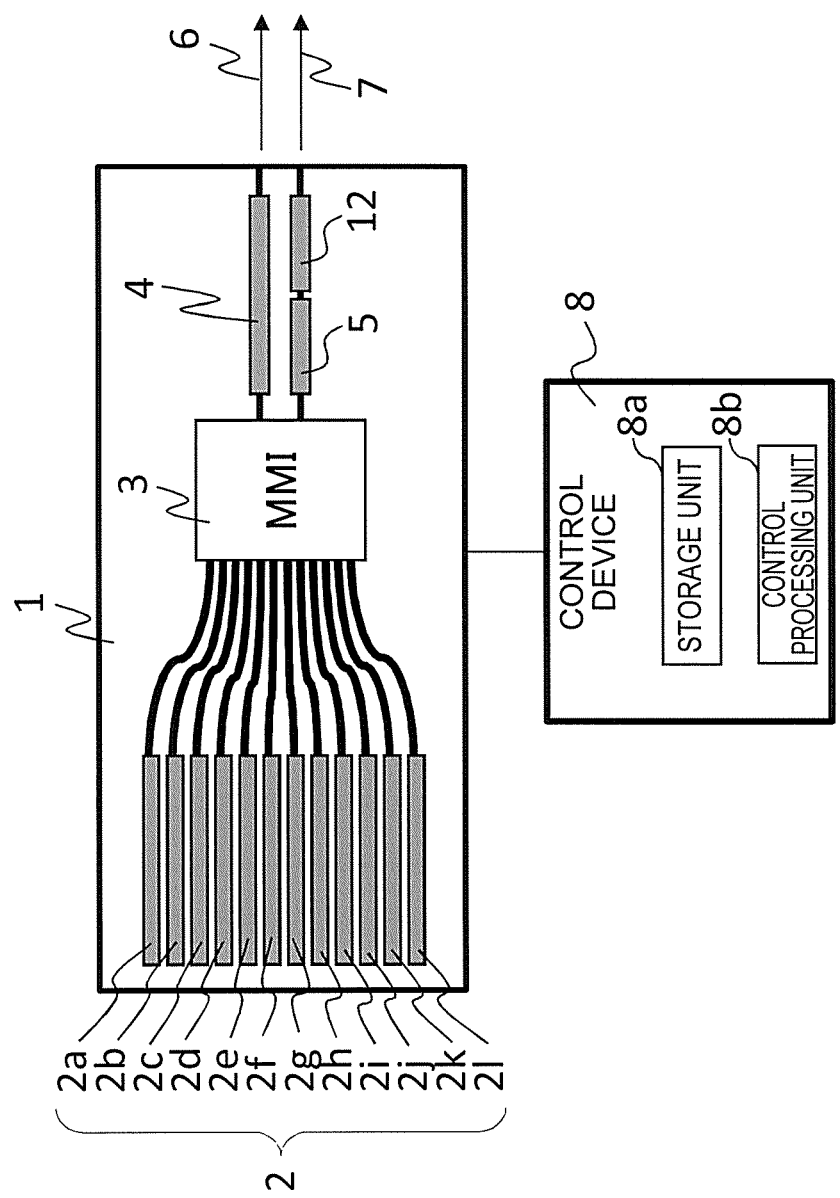
FIG. 5 is a configuration diagram of a wavelength tunable light source according to a fourth embodiment of the present invention.

FIG. 5 is a configuration diagram of a wavelength tunable light source according to a fourth embodiment of the present invention. The wavelength tunable laser device 1, which corresponds to the wavelength tunable light source according to the fourth embodiment, includes the LDs 2, the MMI 3, the first SOA 4, the second SOA 5, and a third SOA 9. As compared to the configuration of FIG. 1 in the first embodiment described above, the configuration of FIG. 5 in the fourth embodiment is different in further including the third SOA 9. Therefore, a description is given mainly of the difference.

The third SOA 9 is formed in the stage subsequent to the second SOA 5, and has a gain and a length that are similar to those of the second SOA 5. Then, in the fourth embodiment, the second emitted beam 7 is output after being amplified in two stages by the second SOA 5 in the former stage and the third SOA 9 in the latter stage, which are connected in series with each other.

A control method during a wavelength switching operation in the fourth embodiment is specifically described. First, as data on a wavelength $\lambda_1$ before wavelength switching, measurement data on an electric current $I_{LDa\text{-}1}$ input to the LD 2a, an electric current $I_{SOA1\text{-}1}$ input to the first SOA 4, an electric current $I_{SOA2\text{-}1}$ input to the second SOA 5, and an electric current $I_{SOA3\text{-}1}$ input to the third SOA 9 are acquired with the use of a wavemeter and an ammeter in an experiment performed in advance, for example. Then, the acquired measurement data is stored as the data on $\lambda_1$ in the storage unit 8a of the control device 8.

Next, from a state in which the electric current $I_{LDa\text{-}1}$, the electric current $I_{SOA1\text{-}1}$, the electric current $I_{SOA2\text{-}1}$, and the electric current $I_{SOA3\text{-}1}$ are input to the LD 2a, the first SOA 4, the second SOA 5, and the third SOA 9, respectively, the electric currents input to the second SOA 5 and the third SOA 9 are changed. Then, an electric current $I_{SOA2\text{-}2}$ of the second SOA 5 and an electric current $I_{SOA3\text{-}2}$ of the third SOA 9 for generating a wavelength $\lambda_2$ after the switching are acquired with the use of the wavemeter and the ammeter to be stored as data on $\lambda_2$ in the storage unit 8a of the control device 8.

When the electric currents of the second SOA 5 and the third SOA 9 are changed, the electric current of the third SOA 9 is changed by the same value in the opposite polarity as an amount of change of the electric current of the second SOA 5.

FIG. 6 is a time chart for showing states of current values in the case where the wavelength switching is performed by the control processing unit 8b based on the data stored in the storage unit 8a in the fourth embodiment of the present invention. As shown in FIG. 6, before the wavelength switching, $I_{LDa\text{-}1}$, $I_{SOA1\text{-}1}$, $I_{SOA2\text{-}1}$, and $I_{SOA3\text{-}1}$ are input to the LD 2a, the first SOA 4, the second SOA 5, and the third SOA 9, respectively.

Then, after the switching, the control processing unit 8b switches the electric current applied to the second SOA 5 from $I_{SOA2\text{-}1}$ to $I_{SOA2\text{-}2}$, and switches the electric current input to the third SOA 9 from $I_{SOA3\text{-}1}$ to $I_{SOA3\text{-}2}$ without changing the electric currents applied to the LD 2a and the first SOA 4. Such switching control is performed by feedforward control.

Next, actions and effects of the wavelength tunable light source according to the fourth embodiment are described.

In the wavelength tunable light source according to the fourth embodiment, the control is performed to increase the electric current input to the second SOA 5 by a certain value, and to reduce the electric current input to the third SOA 9 by a value that is the same as the increased value for the second SOA 5. In this case, the second SOA 5 and the third SOA 9 have the similar gains and lengths, and hence power of the second emitted beam 7 is kept substantially constant.

Moreover, to a change in temperature of the LD 2, a thermal resistance θ1 from the second SOA 5 to the LD and a thermal resistance θ2 from the third SOA 9 to the LD are relevant. In this case, a thermal resistance θ between two points is expressed by the following expression:

$$\theta = L/(\lambda \times A) \qquad (1).$$

In the expression (1) above, L represents a distance between the two points along a path through which heat is transferred, λ represents a heat conductivity of a material through which heat is transferred, and A represents a cross-sectional area of the path through which heat is transferred.

In the fourth embodiment, λ and A are substantially the same for the thermal resistance θ1 and the thermal resistance θ2, but L has a larger value for the third SOA 9, which is arranged further away from the LD than the second SOA 5. In other words, θ1<θ2 is satisfied.

As the thermal resistance becomes smaller, an amount of change in temperature becomes larger for the same change in amount of generated heat. Therefore, in the fourth embodiment, in which the electric current of the second SOA 5 is increased by the certain value and the electric current of the third SOA 9 is reduced by the same value, the temperature of the LD 2 is increased. Therefore, according to the wavelength tunable light source of the fourth embodiment, there can be obtained the effect that the wavelength can be switched without changing the power of the second emitted beam 7.

In the fourth embodiment, assuming a case in which the wavelength $\lambda_2$ after the switching is longer than the wavelength $\lambda_1$ before the switching, the electric current of the second SOA 5 is increased, and the electric current of the third SOA 9 is reduced at the time of the wavelength switching. In contrast, when the wavelength $\lambda_2$ after the switching is shorter than the wavelength $\lambda_1$ before the switching, the electric current of the second SOA 5 is reduced, and the electric current of the third SOA 9 is increased at the time of the wavelength switching.

Moreover, in the fourth embodiment, the description has been given under the condition that the second SOA 5 and the third SOA 9 have similar gain and length. However, this condition is not essential to the present invention, but is a preferred condition for obtaining the effects of the fourth embodiment. In other words, as long as a change in power of the second emitted beam 7 caused by the change in electric current of the second SOA 5 can be canceled by the change in electric current of the third SOA 9, it is not required to satisfy the above-mentioned condition.

Further, in the fourth embodiment, there has been described the case in which the third SOA 9 is provided in the stage subsequent to the second SOA 5. However, the third SOA 9 may be arranged in a stage subsequent to the first SOA 4 instead of the second SOA 5, the electric current of the first SOA 4 may be increased by a certain value, and the electric current of the third SOA 9 may be reduced by the same value. Also in this case, similar effects can be obtained.

As described above, according to the fourth embodiment, with the SOAs configured to amplify the emitted beam having the two-stage configuration, there is adopted the configuration in which the control to switch the wavelength of the emitted laser beams to a desired value is performed. Also with this configuration, effects similar to those of the first embodiment described above can be obtained.

The second to fourth embodiments described above have been described for the case in which the wavelength switching control is performed by controlling the values of the input electric currents. However, also in the second to fourth embodiments, as described above in the first embodiment, the wavelength switching control may be performed also by controlling applied voltage values instead of the values of the input electric currents, and similar effects can be obtained also in this case.

The invention claimed is:

1. A wavelength tunable light source, comprising:
a wavelength tunable laser device configured to output a first emitted beam and a second emitted beam from M beams, M being 2 or more; and
a control device configured to perform control so as to switch wavelengths of the first emitted beam and the second emitted beam to a desired value by controlling the wavelength tunable laser device,
wherein the wavelength tunable laser device includes:
M laser diodes configured to generate laser oscillation to output beams;
a multiplexer/demultiplexer configured to multiplex the beams output from the M laser diodes to bifurcate the beams into a first output beam and a second output beam for output;
a first semiconductor optical amplifier configured to amplify the first output beam output from the multiplexer/demultiplexer to output the first emitted beam; and
a second semiconductor optical amplifier configured to amplify the second output beam output from the multiplexer/demultiplexer to output the second emitted beam, and
wherein the control device is configured to perform wavelength switching control on the wavelengths of the first emitted beam and the second emitted beam by switching an electric power input to one of the M laser diodes and an electric power input to the second semiconductor optical amplifier while maintaining an electric power input to the first semiconductor optical amplifier before and after the wavelength switching, for temperature adjustment using the one of the M laser diodes and the second semiconductor optical amplifier as heat sources.

2. A wavelength tunable light source according to claim 1, wherein the control device includes a storage unit having stored therein in advance, in order to perform control to switch both of the first emitted beam and the second emitted beam from a first wavelength before the switching to a second wavelength after the switching, when an electric power to be input to one of the M laser diodes is defined as an LD power, an electric power to be input to the first semiconductor optical amplifier is defined as a first SOA power, an electric power to be input to the second semiconductor optical amplifier is defined as a second SOA power, the first SOA power has the same value before and after the wavelength switching, the LD power and the second SOA power for obtaining the first wavelength are defined as a first power and a second power, respectively, and the LD power and the second SOA power for obtaining the second wavelength are defined as a third power and a fourth power, respectively, a correspondence among the first SOA power, the first power, the second power, the third power, and the fourth power, and
wherein the control device is configured to perform the control to switch the wavelengths of the first emitted beam and the second emitted beam from the first wavelength to the second wavelength by referring to the correspondence stored in the storage unit to maintain the first SOA power before and after the wavelength switching, input the first power as the LD power and the second power as the second SOA power before the wavelength switching, and input the third power as the LD power and the fourth power as the second SOA power after the wavelength switching.

3. A wavelength tunable light source according to claim 2, wherein the storage unit has stored therein in advance the correspondence in which the first power and the third power have the same value so that the LD power has the same value before and after the wavelength switching, and
wherein the control device is configured to perform the control to switch the wavelengths of the first emitted beam and the second emitted beam from the first wavelength to the second wavelength by referring to the correspondence stored in the storage unit to maintain the first SOA power and the LD power before and after the wavelength switching, input the second power as the second SOA power before the wavelength switching, and input the fourth power as the second SOA power after the wavelength switching.

4. A wavelength tunable light source according to claim 2, wherein the storage unit has stored therein in advance the correspondence in which the first power and the third power are defined as electric powers to be input to the same laser diode in switching the LD power before and after the wavelength switching, and
wherein the control device is configured to perform the control to switch the wavelengths of the first emitted beam and the second emitted beam from the first wavelength to the second wavelength by inputting the first power to the same laser diode before the wavelength switching, and inputting the third power to the same laser diode after the wavelength switching.

5. A wavelength tunable light source according to claim 2, wherein the storage unit has stored therein in advance the correspondence in which, when the LD power is switched before and after the wavelength switching, a first laser diode, which is configured to generate laser oscillation before the wavelength switching, and a second laser diode, which is different from the first laser diode and is configured to generate laser oscillation after the wavelength switching, are determined in advance, and the first power to be input to the first laser diode and the third power to be input to the second laser diode are defined, and
wherein the control device is configured to perform the control to switch the wavelengths of the first emitted beam and the second emitted beam from the first wavelength to the second wavelength by inputting the first power to the first laser diode before the wavelength switching, and inputting the third power to the second laser diode after the wavelength switching.

6. A wavelength tunable light source according to claim 2, further comprising a third semiconductor optical amplifier, which is connected in series in a stage subsequent to the second semiconductor optical amplifier, and is configured to amplify an optical signal that has been amplified by the second semiconductor optical amplifier to output the amplified optical signal as the second emitted beam,
wherein the storage unit has stored therein in advance, in order to perform the control to switch both of the first emitted beam and the second emitted beam from the first wavelength before the switching to the second wavelength after the switching, when an electric power to be input to the third semiconductor optical amplifier is defined as a third SOA power, the first SOA power has the same value before and after the wavelength switching, the LD power, the second SOA power, and the third SOA power for obtaining the first wavelength are defined as the first power, the second power, and a fifth power, respectively, and the LD power, the second SOA power, and the third SOA power for obtaining the second wavelength are defined as the third power, the fourth power, and a sixth power, respectively, and in order to cancel a change in power of the second emitted beam caused by switching the second SOA power from the second power to the fourth power with a change in power of the second emitted beam caused by switching the third SOA power from the fifth power to the sixth power, a correspondence among the first SOA power, the first power, the second power, the third power, the fourth power, the fifth power, and the sixth power, and
wherein the control device is configured to perform the control to switch the wavelengths of the first emitted beam and the second emitted beam from the first wavelength to the second wavelength by inputting the second power to the second semiconductor optical amplifier and the fifth power to the third semiconductor optical amplifier before the wavelength switching, and inputting the fourth power to the second semiconductor optical amplifier and the sixth power to the third semiconductor optical amplifier after the wavelength switching.

7. A wavelength tunable light source according to claim 2, wherein the storage unit has defined therein, as a current value, each power included in the correspondence, and
wherein the control device is configured to perform the control to switch the wavelengths of the first emitted beam and the second emitted beam from the first wavelength to the second wavelength by referring to the correspondence stored in the storage unit to control the current value before and after the wavelength switching.

8. A wavelength tunable light source according to claim 2, wherein the storage unit has defined therein, as a voltage value, each power included in the correspondence, and
wherein the control device is configured to perform the control to switch the wavelengths of the first emitted beam and the second emitted beam from the first wavelength to the second wavelength by referring to the correspondence stored in the storage unit to control the voltage value before and after the wavelength switching.

9. A wavelength switching control method for a wavelength tunable light source, which is executed in a wavelength tunable light source including a wavelength tunable laser device and a control device,
the wavelength tunable laser device including:
M laser diodes configured to generate laser oscillation to output beams;
a multiplexer/demultiplexer configured to multiplex the beams output from the M laser diodes to bifurcate the beams into a first output beam and a second output beam for output;
a first semiconductor optical amplifier configured to amplify the first output beam output from the multiplexer/demultiplexer to output a first emitted beam; and
a second semiconductor optical amplifier configured to amplify the second output beam output from the multiplexer/demultiplexer to output a second emitted beam,
the control device being configured to perform control so as to switch wavelengths of the first emitted beam and the second emitted beam to a desired value by controlling the wavelength tunable laser device,
the wavelength switching control method being executed by the control device and comprising:
a first step of storing in advance, in order to perform control to switch both of the first emitted beam and the second emitted beam from a first wavelength before the switching to a second wavelength after the switching, when an electric power to be input to one of the M laser diodes is defined as an LD power, an electric power to be input to the first semiconductor optical amplifier is defined as a first SOA power, an electric power to be input to the second semiconductor optical amplifier is defined as a second SOA power, the first SOA power has the same value before and after the wavelength switching, the LD power and the second SOA power for obtaining the first wavelength are defined as a first power and a second power, respectively, and the LD power and the second SOA power for obtaining the second wavelength are defined as a third power and a fourth power, respectively, a correspondence among the first SOA power, the first power, the second power, the third power, and the fourth power in a storage unit;
a second step of referring, when the first emitted beam and the second emitted beam having the first wavelength are to be output, to the correspondence stored in the storage unit to input the first SOA power to the first semiconductor optical amplifier, input the first power as the LD power, and input the second power as the second SOA power; and
a third step of referring, when the first wavelength is to be switched to the second wavelength to output the first emitted beam and the second emitted beam, to the correspondence stored in the storage unit to maintain the electric power input to the first semiconductor optical amplifier at the first SOA power, input the third power as the LD power, and input the fourth power as the second SOA power.

* * * * *